(12) United States Patent
Dinc et al.

(10) Patent No.: US 12,483,209 B2
(45) Date of Patent: Nov. 25, 2025

(54) METHODS AND APPARATUS FOR POWER AMPLIFIER TRANSFORMERS

(71) Applicant: Texas Instruments Incorporated, Dallas, TX (US)

(72) Inventors: Tolga Dinc, Dallas, TX (US); Swaminathan Sankaran, Allen, TX (US); Baher Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 776 days.

(21) Appl. No.: 17/491,096

(22) Filed: Sep. 30, 2021

(65) Prior Publication Data

US 2022/0224295 A1   Jul. 14, 2022

Related U.S. Application Data

(60) Provisional application No. 63/136,485, filed on Jan. 12, 2021.

(51) Int. Cl.
  *H03F 3/68* (2006.01)
  *H03F 1/56* (2006.01)
  *H03F 3/195* (2006.01)
  *H03F 3/24* (2006.01)
  *H03F 3/26* (2006.01)

(52) U.S. Cl.
  CPC ............. *H03F 3/245* (2013.01); *H03F 1/565* (2013.01); *H03F 3/195* (2013.01); *H03F 2200/451* (2013.01); *H03F 2200/541* (2013.01)

(58) Field of Classification Search
  CPC .......... H03F 3/245; H03F 1/565; H03F 3/195; H03F 2200/451; H03F 2200/541; H03F 2200/411; H03F 2200/537; H03F 3/26; H03F 3/193; H03F 3/211; H03F 3/45179; H03F 2200/534; H03F 2203/45172; H03F 2203/45228
  USPC ........ 330/165, 171, 188, 190, 195, 197, 276
  See application file for complete search history.

(56) References Cited

U.S. PATENT DOCUMENTS

| | | | | |
|---|---|---|---|---|
| 4,788,634 A | * | 11/1988 | Schlecht | H02M 3/3374 363/75 |
| 5,907,479 A | * | 5/1999 | Leu | H02M 3/3353 363/21.08 |
| 8,902,622 B2 | * | 12/2014 | Suzuki | H02M 7/003 363/127 |
| 10,797,657 B2 | * | 10/2020 | Takenaka | H03H 7/38 |

(Continued)

OTHER PUBLICATIONS

Zhang, et al., "A High-Efficiency Linear Power Amplifier for 28GHz Mobile Communications in 40nm CMOS", RSUIF-9, Texas Instruments Virtual Library, from IEEE Xplore, Jun. 4, 2021, pp. 33-36.

(Continued)

*Primary Examiner* — Khanh V Nguyen
(74) *Attorney, Agent, or Firm* — Mandy Barsilai Fernandez; Frank D. Cimino (57) ABSTRACT

An example apparatus includes a first transformer winding having a first proximal end and a first distal end and a second transformer winding having a second proximal end and a second distal end, the first proximal end having a first distance from the second proximal end and the first distal end having a second distance from the second distal end, the first distance less than the second distance.

20 Claims, 5 Drawing Sheets

(56) References Cited

U.S. PATENT DOCUMENTS

2022/0208674 A1* 6/2022 Wada ................. H01L 23/5227

OTHER PUBLICATIONS

Shaheen, et al., "A Fully Differential Single-Stage Four-way mmWave Power Combiner for Phased Array 5G Systems", University of Oulu, Finland, Texas Instruments Virtual Library, from IEEE Xplore, Jun. 4, 2021, pp. 562-565.
Gu, et al., "Two-Way Current-Combining W-Band Power Amplifier in 65-nm CMOS", IEEE Transactions on Microwave Theory and Techniques, vol. 60, No. 5, May 2012, pp. 1365-1374.
Simburger, et al., "A Monolithic Transformer Coupled 5-W Silicon Power Amplifier with 59% PAE at 0.9 GHz", IEEE Journal of Solid-State Circuits, vol. 34, No. 12, Dec. 1999, pp. 1881-1892.

* cited by examiner

METHODS AND APPARATUS FOR POWER AMPLIFIER TRANSFORMERS

CROSS-REFERENCE TO RELATED APPLICATION

This patent application claims the benefit of and priority to U.S. Provisional Patent Application Ser. No. 63/136,485 filed Jan. 12, 2021, which is hereby incorporated herein by reference in its entirety.

TECHNICAL FIELD

This description relates generally to transformers, and more particularly to methods and apparatus for power amplifier transformers.

BACKGROUND

Some electronic devices include one or more transceivers to communicate with other devices using radio frequency (RF) signals. Such transceivers include RF power amplifiers to convert low-power RF signals corresponding to data to a higher power signal that drives an antenna of the transceiver to transmit the data to other devices. Such RF power amplifiers may include matching networks to create a matched impedance between an input stage and a modulator, between an output stage and the input stage, and between a load (such as an antenna) and the output stage.

SUMMARY

For methods and apparatus for power amplifier transformers, an example apparatus includes a first transformer winding. The first transformer winding includes a first proximal end and a first distal end. The example apparatus includes a second transformer winding. The second transformer winding includes a second proximal end and a second distal end, the first proximal end having a first distance from the second proximal end and the first distal end having a second distance from the second distal end, the first distance less than the second distance.

DETAILED DESCRIPTION

The drawings are not necessarily to scale. Generally, the same reference numbers in the drawing(s) and this description refer to the same or like parts. Although the drawings show layers and regions with clean lines and boundaries, some or all of these lines and/or boundaries may be idealized. In reality, the boundaries and/or lines may be unobservable, blended and/or irregular.

A power amplifier is a last stage in a radio frequency (RF) transmitter and is used to amplify a signal level so that the RF transmitter can deliver a required output power to an antenna. The RF transmitter may be a part of a radar system, a communication system, and/or any type of wireless system. In a radar system application, the system may operate at a high level of frequency (such as 77 Gigahertz (GHz)). In such an example, the power amplifier (PA) must be designed to deliver 15 dBm-17 dBm (such as approximately 50 milliwatts (mW)). Power amplifiers use large devices to deliver such output power and improve output power with high efficiency. Especially switching power amplifiers, which use significantly large devices (such as large MOSFETs) to reduce switching on resistance. However, driving the PA devices becomes harder and harder with increased device size due to large parasitic capacitances induced by the larger devices. For example, parasitic capacitance may be introduced by the MOSFET devices in the matching network, between the stages of a driver (such as circuitry that drives and/or facilitates operation of the PA) and the PA stage. In some examples, smaller matching components are needed to compensate for this parasitic capacitance.

In some examples, a transformer is provided between the driver stage and the PA stage for implementing the matching network. The transformer may include of two inductors magnetically coupled to each other. The transformer includes a primary stage and a secondary stage. In this example, the primary stage may be coupled to an output of the driver, which may be smaller in size than the PA. The secondary stage is coupled to the primary stage and to the PA. The driver, being smaller than the PA, has a smaller parasitic capacitance. The parasitic capacitances are resonated, by the driver and PA, at the operating frequency of the radar system and, thus, the primary side of the transformer requires a bigger inductance than the secondary side of the transformer, because a larger capacitance exists in the secondary side which needs to be resonated, so a smaller inductance is needed to resonate the larger capacitance.

When designing the transformer for the PA, the transformer is to include a large turn ratio, such that a primary coil includes a greater inductance than a secondary coil to ensure that there is a smaller secondary inductance at the PA input. However, quality factor (such as an indication of a performance of the transformer) and coefficient of coupling (such as a fraction of magnetic flux produced by current in one coil that links with the other coil) of the transformer degrades with increased turn ratio and reduced coil size, which limits a signal swing at the PA input and, thus, degrades the output power and efficiency. All of these limitations are exacerbated with increased operating frequency (e.g. at millimeter-wave frequencies).

Previous solutions addressed the problem of poor quality factor and coefficient of coupling of the transformer by implementing power combiners. Power combiners can facilitate a high turn ratio without sacrificing quality factor and coefficient of coupling by splitting last stage into multiple paths, thus avoiding large device capacitances Power combiners, also referred to as power splitters, split the input signal into multiple paths, amplify the split input signals separately, and use series or parallel combiners at the output. Some power combiners, however, are designed to have multiple lead lines (such as excessive routing) depending on the type of PA that the transformers are providing a signal to. At high frequencies, excessive routing in a power combining system results in unwanted (such as parasitic) losses. In some examples, power combiners have high loss due to the splitting process sharing the same signal between a number of outputs, which degrades the overall PA output power and efficiency. Therefore, a need exists for a transformer that includes a minimal amount of connections and optimizes an operation of the PA in high operating frequency systems.

Examples described herein improve the efficiency of power combiners and, thus, improves the efficiency of PA operation and output power. Examples described herein implement a split and combine transformer, having secondary windings angled relative to a central axis, that includes a higher primary inductance and a lower secondary inductance. The transformer described herein is made up of two transformers, where two secondary windings of the transformers both have the same inductance as two primary windings (such as a 1:1 ratio between primary side and secondary side). The two primary windings are connected in series and the two secondary windings are connected in parallel. The parallel connection of the two secondary windings reduces the inductance of the secondary side and, thus, the transformer has a higher primary inductance and a lower secondary inductance. Rather than having one smaller winding in the secondary side of the transformer, two large windings are connected in parallel to avoid a degrading of quality factor and coupling coefficient. In some examples, the split and combine transformer may split and combine k coils, such that a number of primary windings may differ from a number of secondary windings. In such an example, the number of secondary windings have a combined number of turns equal to a combined number of turns of the number of primary windings, such that the turn ratio of the split and combine transformer is still 1:1.

In examples described herein, the transformers are angled at from a central axis that extends between the transformers and bisects the outputs of the transformers. For example, the transformer extends from the central axis at a first angle and a second transformer extends from the central axis at a second angle. The outputs of the transformers are located at respective proximal ends of the transformers and center taps of the transformers are located at respective distal ends of the transformers. A distance between the proximal ends is less than a distance between the distal ends and, thus, the outputs are closer to the central axis than the center taps. Such angling of transformers shortens the routing at the output of the transformers which improves the parasitic inductance of the transformer.

As used herein, the terms "coefficient of coupling" and "coupling coefficient" are defined as a value that indicates the efficiency of transferring power from one side of a transformer coil to the other side of the transformer coil. For example, when current flows through one coil (such as the primary coil), the current produces flux (such as magnetic flux). The whole flux may not link with the other coil (such as the secondary coil) connected to the one coil (such as the primary coil) because of leakage flux, which is denoted by a fraction (k). The fraction (k) is the coupling coefficient. When the coupling coefficient is equal to one (1), the flux produced by one coil completely links with the other coil and is magnetically tightly connected to the other coil. When the coupling coefficient is equal to zero (0), the flux produced by one coil does not link at all with the other coil and, thus, the coils are said to be magnetically isolated.

As used herein, "routing" and/or "track" are terms used to refer to a wiring structure of a printed circuit board (PCB). The term "routing" may refer to a single wiring structure (such as a single wire coupling two components) and/or multiple wiring structures (such as more than one wire coupling two or more components).

As used herein, "power added efficiency," "PAE," and/or "linearity" are metrics for rating power amplifiers. PAE and/or linearity can be metrics by which customers determine which power amplifiers to purchase. For example, power amplifiers with a PAE below a certain level may not be purchased by a customer due to the impact of PAE on a customer product. A lower PAE can, for example, reduce the battery life of an electronic device, such as a mobile phone. However, enhancing PAE can come at the cost of reducing linearity. Similarly, increasing linearity can cause a decrease in PAE. In some examples, PAE is measured as a percentage.

Figure 1:
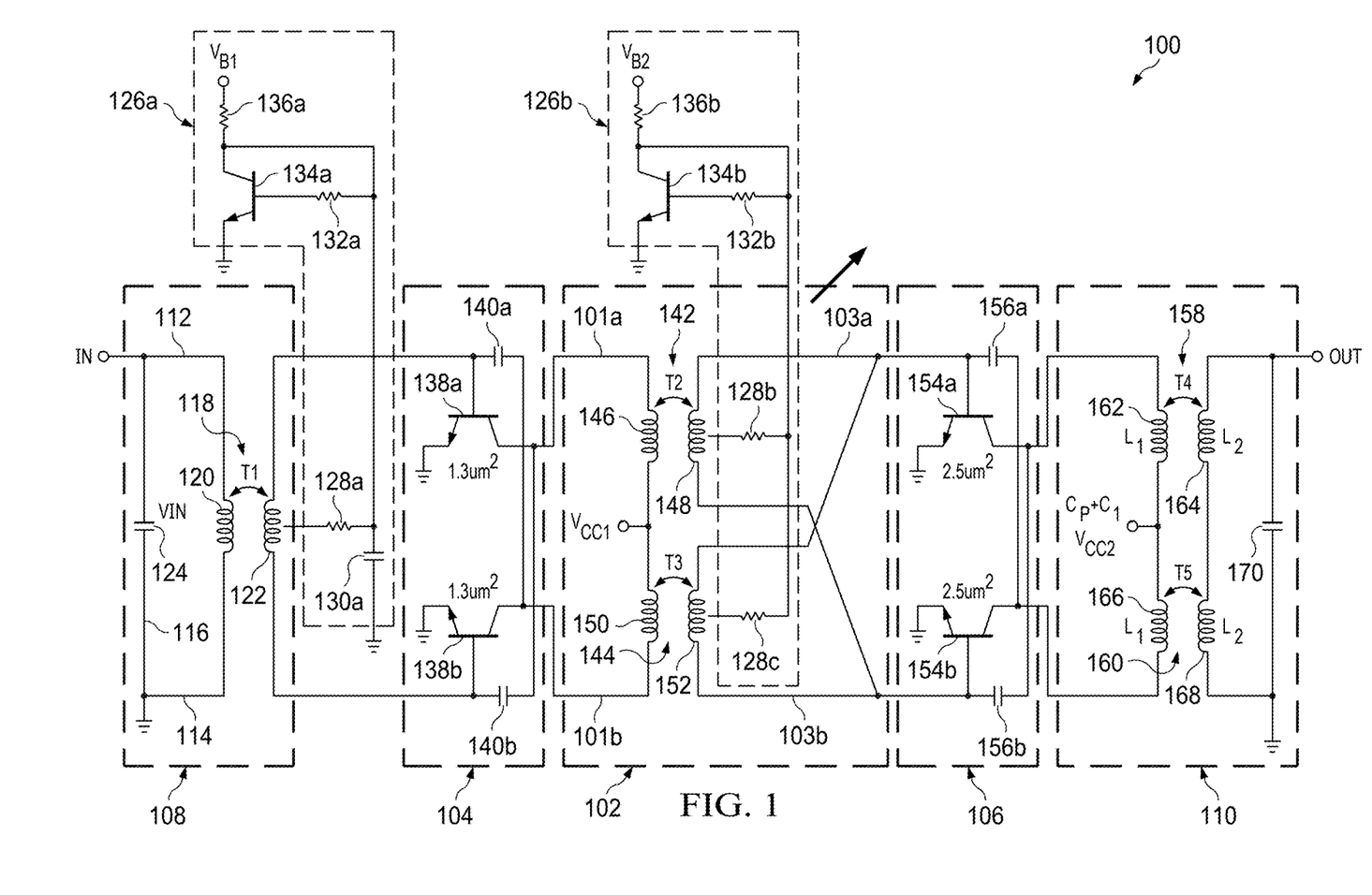
FIG. 1 is a schematic diagram of an example power amplifier including an example split-combine transformer for coupling and impedance matching.

FIG. 1 is a schematic diagram of an example power amplifier (PA) 100 including an example split-combine transformer 102 for coupling a driver stage 104 to an output stage 106 and for providing impedance matching between the driver stage 104 and the output stage 106. The example PA 100 further includes an example input matching network 108 and an example output network 110.

In FIG. 1, the example input matching network 108 includes a first input node 112 and a second input node 114 that receive and/or are configured to receive an input voltage (Vin) 116. The input voltage (Vin) 116 is an RF signal that is positive at the first input node 112 relative to the second input node 114, wherein the second input node can be a ground node and/or any other reference voltage connection. The input matching network 108 includes an example first transformer (T1) 118 having an example first transformer (T1) primary winding 120 coupled between the first input node 112 and the second input node 114, and an example first transformer (T1) secondary winding 122. The first transformer (T1) 118 is connected as a parallel resonant device using an example input capacitor 124. In some examples, the first transformer (T1) 118 provides impedance transformation and isolation between the input 116 and the driver stage 104.

In FIG. 1, the example input matching network 108 is coupled to a first biasing circuit 126a. In some examples, the first biasing circuit 126a is a DC biasing circuit. The first biasing circuit 126a provides a DC biasing voltage to the driver stage 104. The first biasing circuit 126a includes an example first resistor 128a that is coupled to a center tap of the T1 secondary winding 122, an example first capacitor 130a coupled to the first resistor 128a, an example second resistor 132a coupled to the first capacitor 130a and the first resistor 128a, an example first transistor 134a, and an example third resistor 136a. The first transistor 134a includes an emitter terminal, a collector terminal, and a base terminal (such as a control terminal, a current terminal, etc.). The collector terminal of the first transistor 124a is coupled to the third resistor 136a and configured to receive and/or obtain a first bias voltage ($V_{B1}$). The base terminal of the first transistor 134a is coupled to second resistor 132a, which is coupled to the collector terminal of the first transistor 134a.

In FIG. 1, the example driver stage 104 includes an example second transistor 138a, an example third transistor 138b, an example second capacitor 140a, and an example third capacitor 140b. In this example, the second and third transistors 138a, 138b are NPN bipolar junction transistors (BJTs). Additionally and/or alternatively, the second and third transistors 138a, 138b may be implemented by n-channel metal-oxide-semiconductor field-effect transistors (NFETs), PNP BJTs, and/or any other type of transistor by reconfiguring the components of the driver stage 104. The second transistor 138a includes an emitter terminal (such as a source terminal, a current terminal, etc.), a collector terminal (such as a drain terminal, a current terminal, etc.), and a base terminal (such as a control terminal, a current terminal, etc.). The third transistor 138*b* includes an emitter terminal (such as a source terminal, a current terminal, etc.), a collector terminal (such as a drain terminal, a current terminal, etc.), and a base terminal (such as a control terminal, a current terminal, etc.). The second capacitor 140*a* includes a first capacitor terminal and a second capacitor terminal. The third capacitor 140*b* includes a third capacitor terminal and a fourth capacitor terminal.

The base terminal of the second transistor 138*a* is coupled to a first output of the T1 secondary winding 122 and the base terminal of the third transistor 138*b* is coupled to a second output of the T1 secondary winding 122. In some examples, the first output of the T1 secondary winding 122 is a positive side of the winding 122 and the second output of the T1 secondary winding 122 is a ground, reference, and/or negative side of the winding 122. The first capacitor terminal of the second capacitor 140*a* is coupled to the first output of the T1 secondary winding 122 and to the base terminal of the second transistor 138*a*. The second capacitor terminal of the second capacitor 140*a* is coupled to the collector terminal of the third transistor 138*b*. The third capacitor terminal of the third capacitor 140*b* is connected to the second output of the T1 secondary winding 122 and to the base terminal of the third transistor 138*b*. The fourth capacitor terminal of the third capacitor 140*b* is coupled to the collector terminal of the second transistor 138*a*.

The second and third transistors 138*a*, 138*b* comprise a common-emitter differential amplifier to amplify a current generated by the first transformer 118. The example second capacitor 140*a* and the example third capacitor 140*b* provide capacitive cross-coupling neutralization in the driver stage 104. Capacitive neutralization improves the problem of low reverse isolation in power amplifiers with large transistor devices. For example, the transistors 138*a*, 138*b* in the driver stage 104 may be large and, thus, the parasitic gate-to-drain and/or base-to-collector capacitances of the transistors 138*a*, 138*b* are also large. Such parasitic base-to-collector capacitance lowers the reverse isolation, as well as power gain and stability of the power amplifier 100. Cross-coupling capacitors 140*a*, 140*b* between base and collector of the respective opposite-side transistor cancels the parasitic base-to-emitter capacitance and improves reverse isolation. As used herein, reverse isolation is a measure of how well a signal applicated at an output of the power amplifier 100 is "isolated" from the input nodes 112, 114.

In FIG. 1, the split-combine transformer 102 is an interstage matching network between the driver stage 104 and last stage devices (such as output stage 106). The split-combine transformer 102 includes a second transformer (T2) 142 and a third transformer (T3) 144. The second transformer (T2) 142 includes a second transformer (T2) primary winding 146 and a second transformer (T2) secondary winding 148. The third transformer (T3) 144 includes a third transformer (T3) primary winding 150 and a third transformer (T3) secondary winding 152. The T2 primary winding 146 includes a first input and a second input. The T2 secondary winding 148 includes a first output and a second output. The T3 primary winding 150 includes a third input and a fourth input. The T3 secondary winding 152 includes a third output and a fourth output. The T2 primary winding 146 and the T3 primary winding 150 are connected in series and the T2 secondary winding 148 and the T3 secondary winding 152 are connected in parallel.

For example, the first input of the T2 primary winding 146 is connected to the collector terminal of the second transistor 138*a* and the second input of the T2 primary winding 146 is connected to the third input of the T3 primary winding 150. A supply voltage ($V_{CC1}$) is provided at the second input and the third input of the primary windings 146, 150. The first output of the T2 secondary winding 148 is connected to the third output of the T3 secondary winding 152 at a first node 103A and the second output of the T2 secondary winding 148 is connected to the fourth output of the T3 secondary winding 152 at a second node 103B. Similarly, the third output of T3 secondary winding 152 is connected to the first output of T2 secondary winding 148 and the fourth output of the T3 secondary winding 152 is connected to the first output of the T2 secondary winding 148. In some examples, the split-combine transformer 102 is implemented by complimentary metal-oxide semiconductors (CMOS) compatible stacked-type on-chip transformers. Additionally and/or alternatively, the split-combine transformer 102 may be implemented by any type of on-chip transformers.

In some examples, the split-combine transformer 102 is a power combiner to increase the input signal (such as the input current from the driver stage 104) at the output. However, the power combiner (such as the split-combine transformer 102) does not use a high turn ratio in order to achieve the increase and/or amplification of the input signal. Instead, the power combiner (such as the split-combine transformer 102) comprises two transformers 142, 144, where a sum of the secondary winding turns is equal to a sum of primary winding turns. For example, the turn ratio of the second transformer (T2) 142 is 1:1 and the turn ratio of the third transformer (T3) 144 is 1:1. The second transformer (T2) 142 and the third transformer (T3) 144 may include any combination of primary windings and secondary windings, and the sum of the secondary winding turns will always be equal to the sum of the primary winding turns. For example, if the second transformer (T2) 142 includes two secondary windings and one primary winding and the third transformer (T3) 144 includes two secondary windings and one primary winding, a sum of the turns of the four secondary windings is equal to a sum of the turns of the two primary windings. In this manner, the split-combine transformer 102 comprises a 1:1 turn ratio.

The split-combine transformer 102 is able to amplify and/or increase the input signal at the output, without having a high turn ratio, due to the parallel connection of the secondary windings 148, 152. For example, the current of the first output of the T2 secondary winding 148 and the current of the third output of the T3 secondary winding 152 are combined and injected into a base terminal of a first output stage transistor (such as fifth transistor 154*a*). In another example, the current of the second output of the T2 secondary winding 148 and the current of the fourth output of the T3 secondary winding 152 are combined and injected into a base terminal of a second output stage transistor (such as sixth transistor 154*b*) at 180 degree phase difference from the current injected into the base terminal of the first output stage transistor (such as fifth transistor 154*a*). As such, the parallel connection of the secondary windings 148 and 152 put high base currents into the output stage transistors (such as fifth and sixth transistors 154*a*, 154*b*). The split-combine transformer 102 of FIG. 1 is described in further detail below in connection with FIGS. 2, 3, and 4.

In FIG. 1, the example split-combine transformer 102 is connected to a second biasing circuit 126*b*. In some examples, the second biasing circuit 126*b* is a DC biasing circuit. The second biasing circuit 126*b* provides a DC biasing voltage to the output stage 106. The second biasing circuit 126b includes an example fourth resistor 128b that is coupled to a center tap of the T2 secondary winding 148, an example fifth resistor 128c that is coupled to a center tap of the T3 secondary winding 152, an example sixth resistor 132b coupled to the fourth resistor 128b and to the fifth resistor 128c, an example fourth transistor 134b, and an example seventh resistor 136b. The fourth transistor 134b includes an emitter terminal, a collector terminal, and a base terminal (such as a control terminal, a current terminal, etc.). The collector terminal of the fourth transistor 134b is coupled to the seventh resistor 136b and configured to receive and/or obtain a second bias voltage ($V_{B2}$). The base terminal of the fourth transistor 134b is coupled to sixth resistor 132b, which is coupled to the collector terminal of the fourth transistor 134b.

In FIG. 1, the output stage 106 includes an example fifth transistor 154a, an example sixth transistor 154b, an example fifth capacitor 156a, and an example sixth capacitor 156b. In this example, the fifth and sixth transistors 154a, 154b are NPN bipolar junction transistors (BJTs). Additionally and/or alternatively, the fifth and sixth transistors 154a, 154b may be implemented by n-channel metal-oxide-semiconductor field-effect transistors (NFETs), PNP BJTs, and/or any other type of transistor by reconfiguring the components of the output stage 106. The fifth transistor 154a includes an emitter terminal (such as a source terminal, a current terminal, etc.), a collector terminal (such as a drain terminal, a current terminal, etc.), and a base terminal (such as a control terminal, a current terminal, etc.). The sixth transistor 154b includes an emitter terminal (such as a source terminal, a current terminal, etc.), a collector terminal (such as a drain terminal, a current terminal, etc.), and a base terminal (such as a control terminal, a current terminal, etc.). The fifth capacitor 156a includes a fifth capacitor terminal and a sixth capacitor terminal. The sixth capacitor 156b includes a seventh capacitor terminal and an eighth capacitor terminal.

The base terminal of the fifth transistor 154a is connected to the first output of the T2 secondary winding 148 and to the third output of the T3 secondary winding 152. The base terminal of the sixth transistor 154b is connected to the second output of the T2 secondary winding 148 and to the fourth output of the T3 secondary winding 152. The fifth capacitor terminal of the fifth capacitor 156a is connected to the first output of the T2 secondary winding 148, to the third output of the T3 secondary winding 152, and to the base terminal of the fifth transistor 154a. The sixth capacitor terminal of the fifth capacitor 156a is coupled to the collector terminal of the sixth transistor 154b. The seventh capacitor terminal of the sixth capacitor 156b is connected to the second output of the T2 secondary winding 148, to the fourth output of the T3 secondary winding 152, and to the base terminal of the sixth transistor 154b. The eighth capacitor terminal of the sixth capacitor 156b is coupled to the collector terminal of the fifth transistor 154a.

The fifth and sixth transistors 154a, 154b comprise a common-emitter differential amplifier to amplify a power at the output of the split-combine transformer 102. The example fifth capacitor 156a and the example sixth capacitor 156b provide capacitive cross-coupling neutralization in the output stage 106. The example output stage 106 is to provide power gain between the driver stage 104 and a load. The power gain is to have high input impedance and low output impedance.

In FIG. 1, the example output network 110 includes a fourth transformer (T4) 158, a fifth transformer (T5) 160, and an output capacitor 170. The fourth transformer (T4) 158 includes a fourth transformer (T4) primary winding 162 and a fourth transformer (T4) secondary winding 164. The fifth transformer (T5) 160 includes a fifth transformer (T5) primary winding 166 and a fifth transformer (T5) secondary winding 168. The T4 primary winding 162 includes a fifth input and a sixth input and the T4 secondary winding 164 includes a fifth output and a sixth output. The T5 primary winding 166 includes a seventh input and an eighth input and the T5 secondary winding 168 includes a seventh output and an eighth output.

In FIG. 1, the example output capacitor 170 is connected between the secondary windings of the fourth transformer 158 and the fifth transformer 160. For example, the output capacitor 170 is connected between the fifth output of the T4 secondary winding 164 and the eighth output of the T5 secondary winding 168. The fifth input of the T4 primary winding 162 is connected to the collector terminal of the fifth transistor 154a and the sixth input of the T4 primary winding 162 is connected to a second supply voltage (VCC2). The seventh input of the T5 primary winding 166 is connected to the second supply voltage (VCC2) and the eighth input of the T5 primary winding 166 is connected to the collector terminal of the sixth transistor 154b. The secondary windings 164, 168 are connected to a load, such as a filter, an antenna, etc.

In an example operation of the power amplifier 100 of FIG. 1, the driver stage 104 receives an input signal (such as Vin) 116 having a particular center frequency. In some examples, the power amplifier 100 is applicable to various operating frequencies. Accordingly, components of the power amplifier 100 may be different for different operating frequencies and/or frequency ranges. For example, the center frequency may in a first frequency range greater than 76 GHz and/or in a second frequency range less than 81 GHz. The example driver stage 104 amplifies the input voltage 116 to generate an amplified output signal 101 (such as 101a and 101b).

The split-combine transformer 102 is provided to match an impedance between the output of the driver stage 104 and an input of the output stage 106. The split-combine transformer 102 achieves an impedance transformation between the input of the split-combine transformer 102 and the output of the split-combine transformer 102, while maintaining transformation efficiency, due to the sum of primary winding turns equaling the sum of secondary windings turns.

For example, the desired impedance transformation corresponds to a desire for the power amplifier 100 to achieve high power delivery (such as transferring power in the amplified output signal 101 from the driver stage 104 to the output stage 106) while meeting any device requirements (such as requirements of the device implemented the power amplifier 100, such as low supply voltages). To achieve high power delivery at the power amplifier output, an inter-stage matching network, such as the split-combine transformer 102, is to include a low output impedance when transferring the power from the driver stage 104 to the output stage 106. In some example, a high transformation ratio is implemented to ensure a low output impedance, which can lower efficiency of that inter-stage matching network due to power loss between primary and secondary windings having different numbers of coils. Additionally, low output impedance is associated with high sensitivity to parasitic capacitances and/or resistances. However, the split-combine transformer 102 does not lose as much power between primary and secondary windings because the turn ratio of the split-combine transformer 102 is equal (such as 1:1) and, thus, the split-combine transformer 102 is efficient while achieving low output impedance.

In the example operation of the power amplifier 100, the power from the driver stage 104 is transferred to the output stage 106. The output stage 106 further amplifies the power using the common-emitter differential amplifier (such as the fifth and sixth transistors 154a, 154b). The example output network 110 is provided to match an impedance between the output stage 106 and a load (not illustrated).

Figure 2:
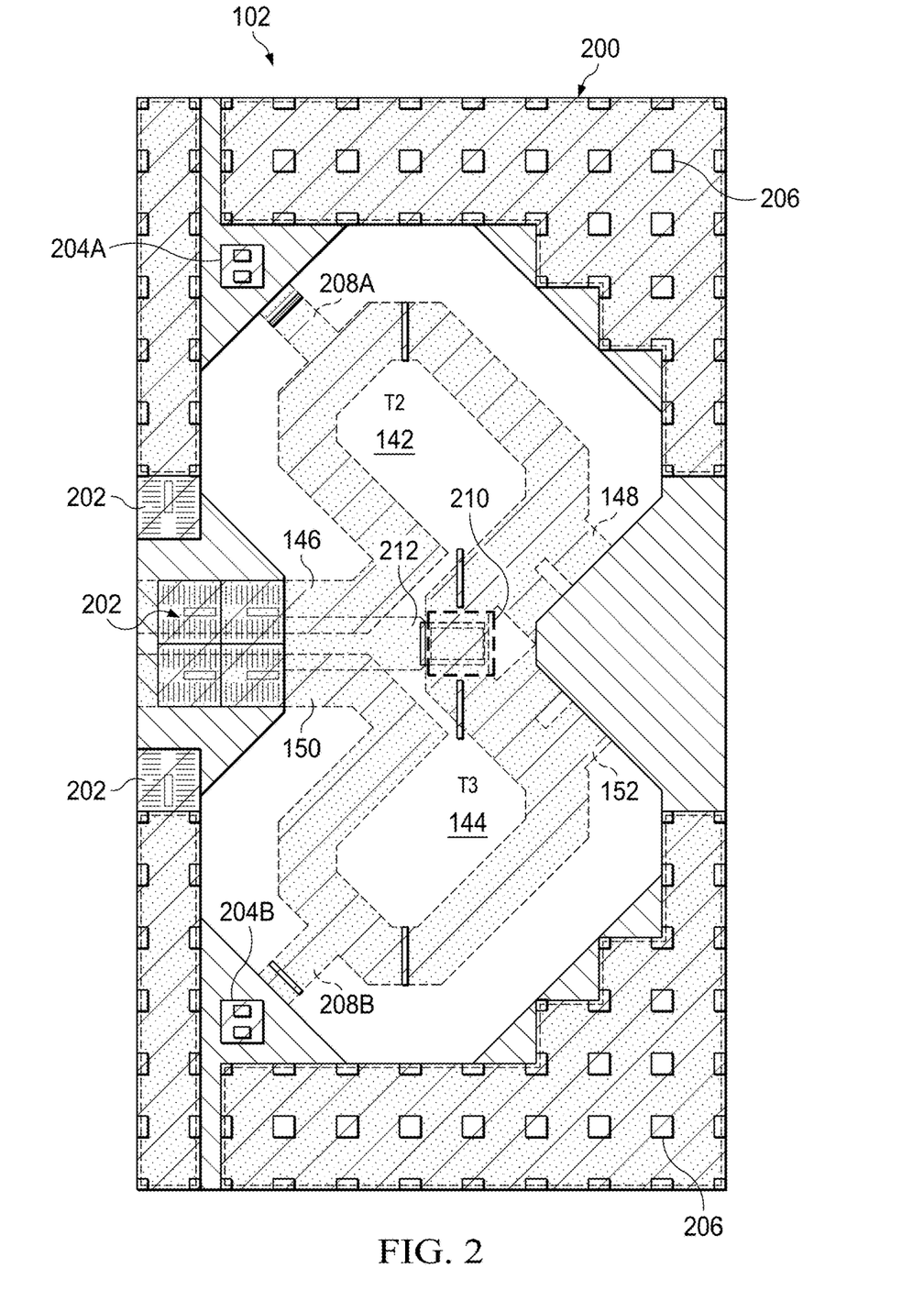
FIG. 2 is a first schematic diagram of the example split-combine transformer of FIG. 1 for coupling and impedance matching.

FIG. 2 is a schematic diagram of the example split-combine transformer 102 of FIG. 1 to provide impedance matching between an output (such as the driver stage 104) and an input (such as the input of the output stage 106) while efficiently increasing power of an input signal (such as Vin 116). The example schematic diagram of FIG. 2 illustrates all metallization layers (layers of conductive materials, such as metals, dielectrics, resin, etc.) of the split-combine transformer 102. For example, the schematic diagram of FIG. 2 is a final implementation of the split-combine transformer 102, including the signal paths, the devices, and any other layers of the split-combine transformer 102. As used herein out, the schematic diagram of FIG. 2 is a first schematic diagram 200 of the split-combine transformer 102 of FIG. 1.

In FIG. 2, the example first schematic diagram 200 includes the example second transformer (T2) 142 and the example third transformer (T3) 144. The example first schematic diagram 200 includes example supply voltage decoupling capacitors 202, example bias circuitry inputs 204A, 204B, and example bias decoupling capacitors 206.

In FIG. 2, the example second transformer (T2) 142 includes the example T2 primary winding 146 and the example T2 secondary winding 148. In the first schematic diagram 200, the T2 primary winding 146 comprises a first layer of material (such as a first metallization layer) shaded with diagonal lines and the T2 secondary winding 148 comprises a second layer of material (such as a second metallization layer) shaded with dots. In FIG. 2, the example third transformer (T3) 144 includes the example T3 primary winding 150 and the example T3 secondary winding 152. Similarly to the T2 primary winding and the T2 secondary winding, the T3 primary winding 150 comprises a first layer of material (such as the first metallization layer), shaded with diagonal lines and the T3 secondary winding 152 comprises the second layer of material (such as the second metallization layer), shaded with dots.

In FIG. 2, the example supply voltage decoupling capacitors (decaps) 202 are connected to and/or coupled between the first supply voltage ($V_{CC1}$) (not illustrated) and the ground. The example supply voltage decaps 202 are depicted as a third layer of material, shaded with vertical lines. In FIG. 2, the example bias circuitry outputs 204A and 204B are coupled, respectively, to center taps 208A and 208B of the T2 and T3 secondary windings 148, 152. For example, a first bias circuitry output 204A is coupled to a first center tap 208A of the T2 secondary winding 148. In this example, a second bias circuitry output 204B is coupled to a second center tap 208B of the T3 secondary winding 152. In FIG. 2, the example bias decaps 206 are connected to and/or coupled between the bias circuitry outputs 204A, 204B and ground (such as coupled between the resistors 128b, 128c, 132b and ground).

Figure 3:
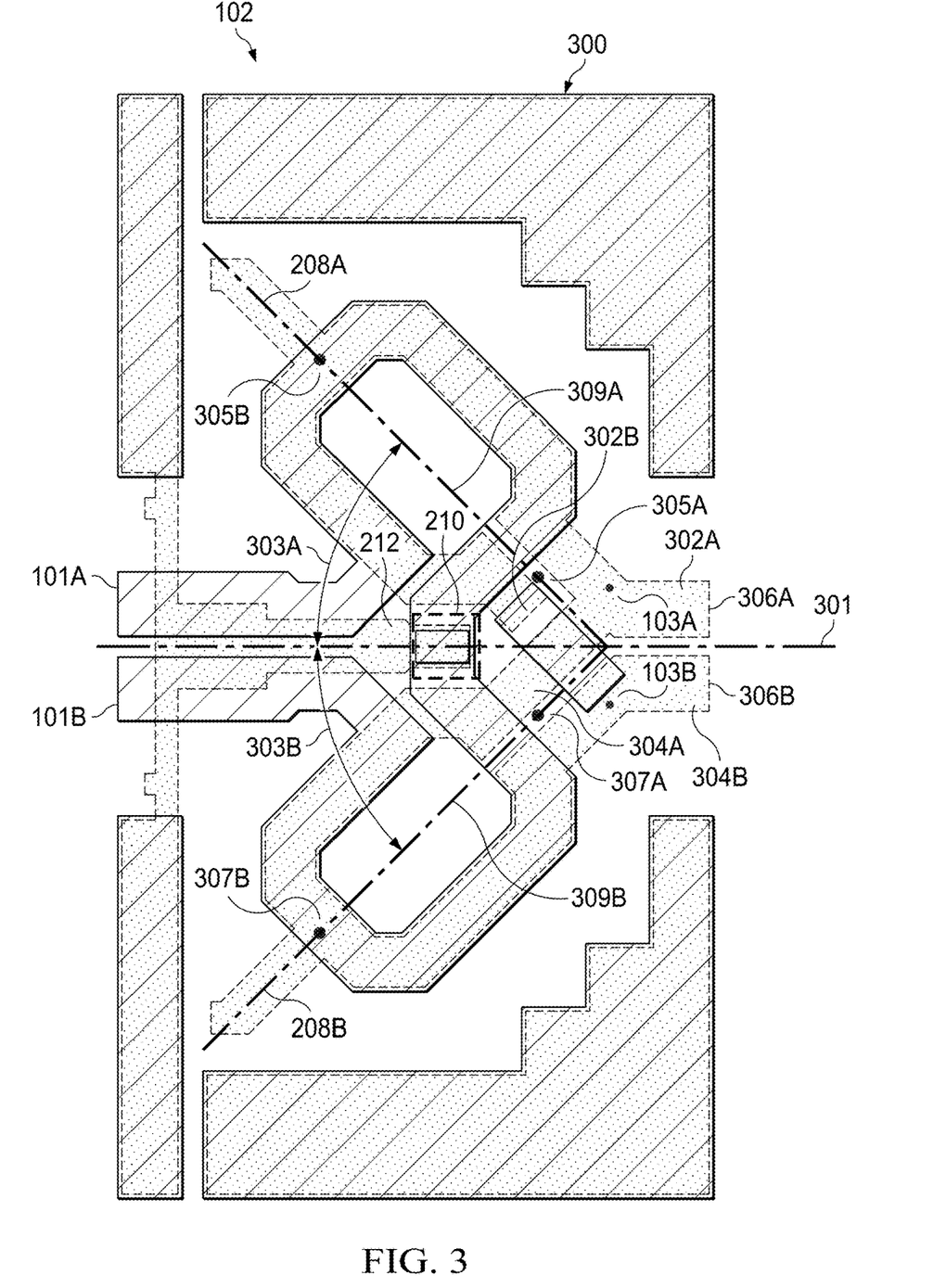
FIG. 3 is a second schematic diagram of the example split-combine transformer of FIG. 1 for coupling and impedance matching.

In FIG. 2, the T2 primary winding 146 is connected to the T3 primary winding 150 in series and the T2 secondary winding 148 is connected to the T3 secondary winding 152 in parallel. FIG. 3 illustrates the series and parallel connections of the second and third transformer 142, 144.

In FIG. 2, the T2 primary winding 146 and the T3 primary winding 150 include an example primary center tap 210. The primary center tap 210 comprises the second metallization layer, shaded by the dots. The example primary center tap 210 enables second ($2^{nd}$) harmonic termination in the split-combine transformer 102. In some examples, harmonic termination is used to tune and/or adjust an output (such as output waveform) of a power amplifier (such as power amplifier 100) by adding or removing some harmonic content. Therefore, the example primary center tap 210 may be coupled to a balancing and/or tuning network that is to achieve a tuning of the output at the second harmonic. In this example, a trace 212 (such as a signal trace) comprising of the second metallization layer, is coupled to the primary center tap 210. In some examples, setting the width of the trace 212 tunes the $2^{nd}$ harmonic frequency. The example primary center tap 210 is located at a more accessible point in the split-combine transformer 102 relative to a transformer in a conventional power combiner.

FIG. 3 is an example second schematic diagram 300 of the split-combine transformer 102 of FIGS. 1 and 2. The second schematic diagram 300 illustrates two layers (such as metallization layers) of the split-combine transformer 102. The first layer corresponds to the T2 primary winding 146 and the T3 primary winding 150 and is depicted by the diagonal lines. The second layer corresponds to the T2 secondary winding 148 and the T3 secondary winding 152 and is depicted by the dots.

In the illustrated example of FIG. 3, the second transformer (T2) 142 includes a first output 302A, a second output 302B, and the first center tap 208A. The third transformer (T3) 144 includes a third output 304A, a fourth output 304B, and the second center tap 208B. In this example, the outputs 302A, 302B, 304A, 304B are outputs of transformer windings. For example, the first and second outputs 302A, 302B are T2 secondary winding outputs and the third and fourth outputs 304A, 304B are T3 secondary winding outputs. As mentioned above, the secondary winding outputs are coupled and/or connected in parallel. In this example, the first output 302A is coupled and/or connected to the third output 304A at a first node 103A. The second output 302B is coupled to and/or connected to the fourth output 304B at the second node 103B. The output at the first node 103A and the output at the second node 103B are 180 degrees out-of-phase.

In the illustrated example of FIG. 3, the second transformer (T2) 142 extends outward from an example central axis 301 of the second schematic diagram 300 at a first angle 303A and the third transformer (T3) 144 extends outward from the example central axis 301 of the second schematic diagram 300 at a second angle 303B. In the illustrated example of FIG. 3, the central axis 301 is a longitudinal axis (such as an axis parallel to a direction of outputs of the split-combine transformer 102, inputs of the split-combine transformer 102, etc.). For example, the central axis 301 extends between the second transformer 142 and the third transformer 144 and bisects a first split-combine output 306A and a second split-combine output 306B of the third transformer 144. In the illustrated example of FIG. 3, the split-combine transformer 102 is symmetric about the central axis 301. In other examples, the split-combine transformer 102 is asymmetric about the central axis 301. In the illustrated example of FIG. 3, both of the angles 303A, 303B are 45°. In other examples, the angles 303A, 303B can have any other suitable value (such as 20°, 30°, 60°, etc.). In some examples, the first angle 303A and the second angle 303B can have different values (such as the first angle 303A is 45° and the second angle 303B 30°, etc.).

In the illustrated example of FIG. 3, the second transformer 142 includes a first proximal end and a first distal end and the third transformer (T3) 144 includes a second proximal end and a second distal end. The first and second outputs 302A, 302B of the second transformer 142 are located at the first proximal end and the first center tap 208A is located at the first distal end. The third and fourth outputs 304A, 304B of the third transformer 144 are located at the second proximal end and the second center tap 208B is located at the second distal end. The first proximal end of the second transformer 142 has a first distance from the second proximal end of the third transformer 144 and the first distal end of the second transformer 142 has a second distance from the second distal end of the third transformer 144. In this example, the first distance is less than the second distance. In this manner, a distance of the first and second outputs 302A, 302B from the third and fourth outputs 304A, 304B is less than a distance of the first center tap 208A from the second center tap 208B. Accordingly, the first and second outputs 302A, 302B of the T2 secondary winding 148 are close in physical distance to the third and fourth outputs 304A, 304B.

In the illustrated example of FIG. 3, the second transformer 142 includes first and second vertices 305A, 305B and the third transformer 144 includes third and fourth vertices 307A, 307B. The first vertex 305A is located at the first proximal end (such as at the first and second outputs 302A, 302B) and the second vertex 305B is located at the first distal end (such as the first center tap 208A). The third vertex 307A is located at the second proximal end (such as at the third and fourth outputs 304A, 304B) and the fourth vertex 307B is located at the second distal end (such as at the second center tap 208B).

In the illustrated example of FIG. 3, a first centerline 309A is defined by the first vertex 305A and the second vertex 305B. A second centerline 309B is defined by the third vertex 307A and the fourth vertex 307B. In FIG. 3, the first centerline 309A and the central axis 301A form the first angle 303A and the second centerline 309B and the central axis 301 form the second angle 303B. In some examples, first centerline 309A and the central axis 301 form an acute angle. In some examples, the second centerline 309B and the central axis 301 form an acute angle. Additionally and/or alternatively, the first centerline 309A and the central axis 301 may form any angle and the second centerline 309B and the central axis 301 may form any angle. In some examples, the first centerline 309A and the second centerline 309B form a right angle. Additionally and/or alternatively, the first centerline 309A and the second centerline 309B for any angle.

Advantageously, the angled orientation of the second transformer 142 and the third transformer 144 improve the efficiency of the split-combine transformer 102 due to minimized routings at the split-combine outputs 306A, 306B. The routings at the split-combine outputs 306A, 306B are minimized relative to outputs of conventional split-combine transformer windings that are parallel to the central axis 301. For example, because the distance of the first proximal end to the second proximal end is less than the distance of the first distal end to the second distal end, the first and second outputs 302A, 302B are close in physical distance to the third and fourth outputs 304A, 304B. Therefore, less routing is needed to connect the first output 302A to the third output 304A and to connect the second output 302B to the fourth output 304B. Less routing in an integrated circuit improves efficiency of the integrated circuit because low output impedance is sensitive to parasitic capacitances. Long routings in an integrated circuit increase the amount of parasitic capacitance and/or resistance in that integrated circuit. Therefore, by positioning the outputs of the secondary windings (such as outputs 302A, 302B, 304A, 304B of secondary windings 148, 152) closer together, the routings are shortened and the parasitic capacitances and/or resistances are reduced.

For example, a conventional power combiner includes two transformers and both transformers may be 100 microns by 100 microns. Such conventional transformers are parallel to a central axis (such as central axis 301) extending between the transformers and bisecting the outputs of the transformers. In order to connect to the secondary winding outputs of those transformers, at least 50 microns of routing from one transformer output and 50 microns of routing from the second transformer output are required to bring the first and second transformer outputs to a common point. However, angling the transformers (such as second transformer 142 and third transformer 144) relative to the central axis 301 enables the output of the transformers 142, 144 to be closer together near the common point and, thus, reduces the length of routing by 50% to 60% relative to conventional power combiners. Reducing the length of routing advantageously reduces the parasitic inductance of the secondary windings 148, 152. If the parasitic inductance is smaller, the secondary windings 148, 152 can be bigger and still achieve the necessary inductance at the secondary side for matching purposes. Advantageously, the bigger the winding, the higher the coupling coefficient and quality factor. Therefore, minimizing the routing facilitates reducing parasitic inductance and increasing the coupling coefficient and quality factor.

Advantageously, the center taps 208A, 208B, and 210 are easily accessible, and thus enables quality design of a harmonically tuned and high efficiency power amplifier 100. For example, the center taps 208A, 208B are located at respective first and second distal ends, which are located at respective distances from the central axis 301 that are greater than respective distances of the first and second proximal ends from the central axis 301. In this manner, the center taps 208A, 208B are distanced from inputs 101A, 101B of the primary windings 146, 150 and from the outputs of the secondary windings 148, 152, leaving them in an easily accessible position. By exposing the center taps 208A, 208B, a harmonic balancing network can be implemented at the secondary center taps (such as center taps 208A, 208B) to enforce a symmetric circuit operation, resulting in improved efficiency in the driver stage 104. In this example, the primary center tap 210 is located between the primary windings 146, 150 and between only a portion of the secondary windings 148, 152. For example, the primary center tap 210 is located near a corner and/or shorter edge of respective secondary windings 148, 152. In a conventional split-combine transformer, the primary center tap may be located near the secondary winding outputs and/or near the longer edges of the secondary windings. Therefore, the location of the primary center tap 210 in the example split-combine transformer 102 avoids overlap and/or coupling between the center tap 210 and the secondary windings 148, 152. Exposing the primary center tap 210 at the input of the split-combine transformer 102 facilitates harmonic termination which improves an output of the driver stage 104 and, thus, efficiency of the driver stage 104 and overall power of the power amplifier (such as power amplifier 100).

Figure 4:
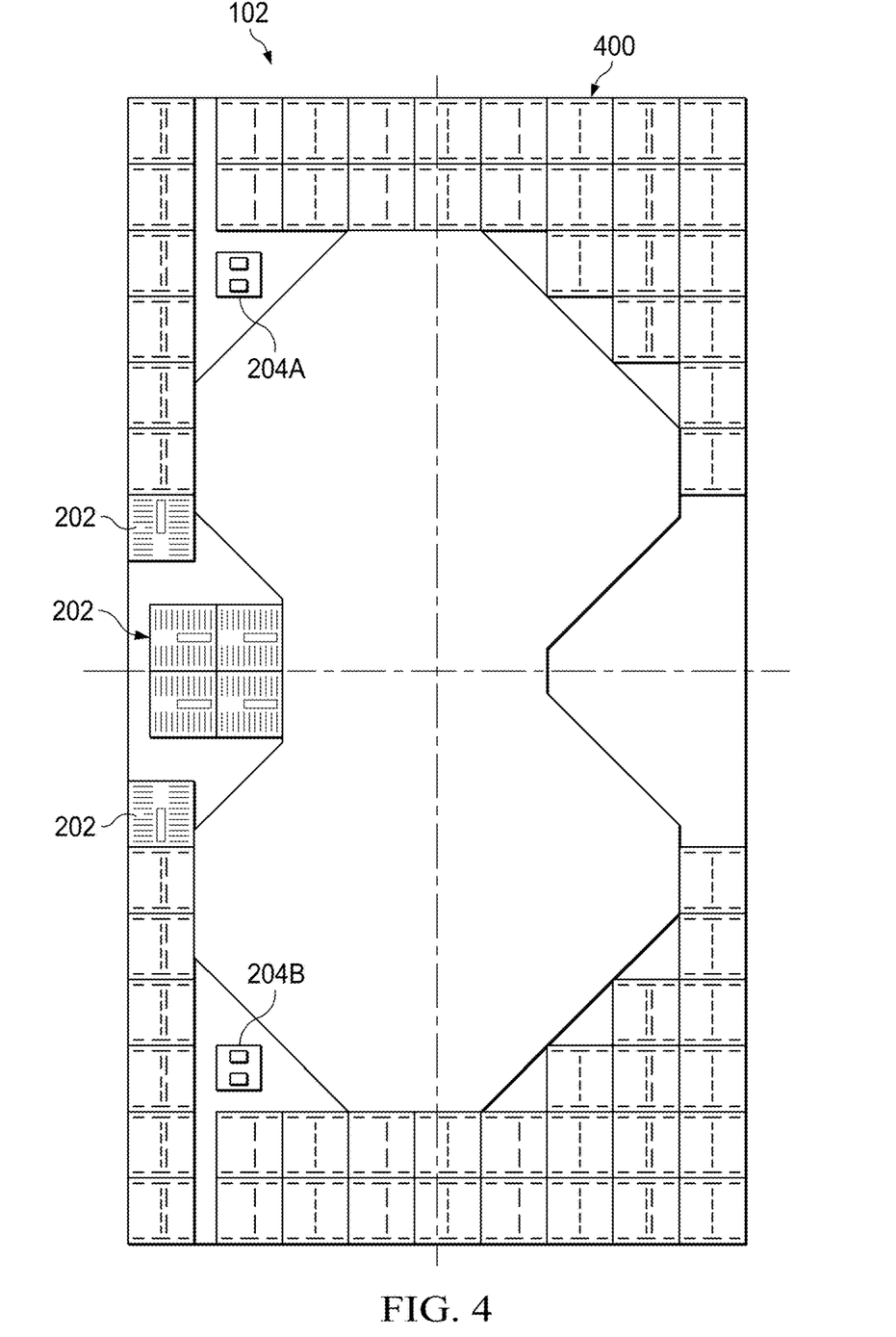
FIG. 4 is a third schematic diagram of the example split-combine transformer of FIG. 1 for coupling and impedance matching.

FIG. 4 is an example third schematic diagram 400 of the split-combine transformer 102 of FIGS. 1 and 2. The third schematic diagram 400 illustrates one layer (such as one metallization layer) of the split-combine transformer 102. The layer corresponds to the material implementing the supply voltage decaps 202, the bias circuitry inputs 204A, 204B and ground routing. The layer is positioned under the first and second layers of the second and third transformers 142, 144. For example, the material implementing the supply voltage decoupling capacitors 202 and the bias circuitry inputs 204A, 204B is positioned underneath the material implementing the primary windings 146, 150 and the secondary windings 148, 152.

Figure 5:
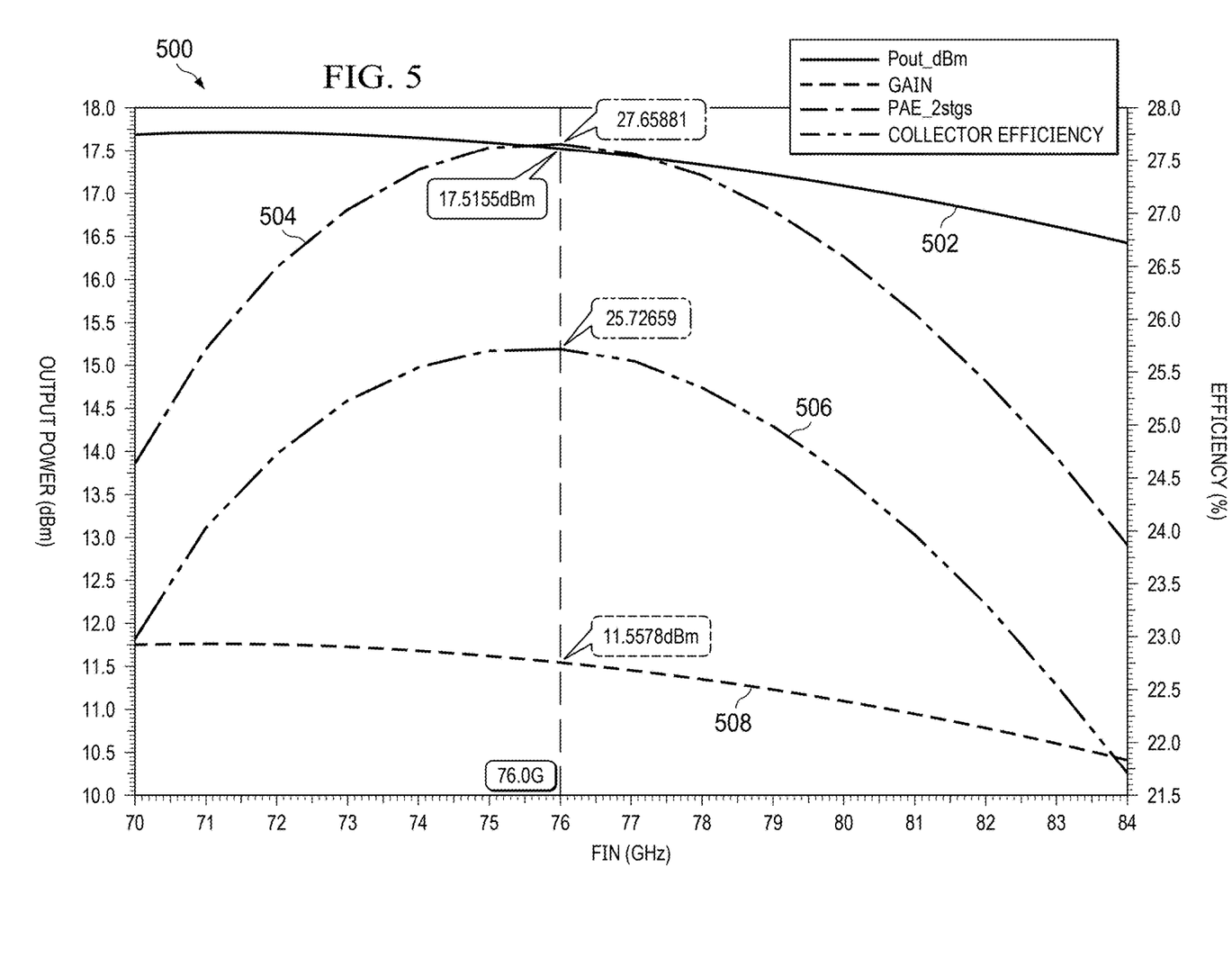
FIG. 5 is a graph of output power of the example power amplifier of FIG. 1 with respect to operating frequency of the example power amplifier of FIG. 1.

FIG. 5 is a graph 500 of output power of the example power amplifier 100 of FIG. 1 with respect to operating frequency (fin) of the example power amplifier 100 of FIG. 1. The graph 500 includes a first line 502, a second line 504, a third line 506, and a fourth line 508. The output power of the example power amplifier 100 is measured in terms of decibels per milliwatt (dBm) and the operating frequency of the power amplifier 100 is measured in terms of Giga hertz (GHz).

In FIG. 5, the first line 502, the second line 504, the third line 506, and the fourth line 508 are indicative of a performance of the power amplifier 100 of FIGS. 1 and 2. For example, the first line 502 represents the output power of the power amplifier 100, the second line 504 represents the collector efficiency, the third line 506 represents the power added efficiency of the power amplifier 100, and the fourth line 508 represents the gain of the power amplifier 100.

In FIG. 5, the PAE, represented by the third line 506, is defined by a difference in output power to input power divided by DC power dissipation of the power amplifier 100. The collector efficiency, represented by the second line 504, is defined by output power of the power amplifier 100 divided by DC power dissipation of the power amplifier 100. The gain, represented by the fourth line 508, is defined by a ratio of output power to input power.

In this example, the power amplifier operating frequency is 76 GHz. The PAE is 25.8% when the power amplifier 100 is operating at 76 GHz. The output power of the power amplifier 100 is 17.5 dBm at the operating frequency. The gain of the power amplifier 100 at the operating frequency is 11.6 dBm. The collector efficiency of the power amplifier 100 is 27.7% at 76 GHz. These values of performance are an improvement relative to a conventional power amplifier without a 45 degree split-combine transformer. For example, an inter-stage matching network having one or more transformers with a 2:1 turn ratio and a small secondary coil degrades the quality factor by 10% to 15% and the coupling coefficient by at least 25%. In such an inter-stage matching network, the degradation of quality factor and coupling coefficient incurs higher interstage losses and eventually, the PAE degrades by about 10%.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

Example methods, apparatus and articles of manufacture described herein improve output power and efficiency of power amplifiers by implementing an inter-stage matching network between the driver stage and output stage that comprises two 1:1 transformers having a primary windings connected in series and secondary windings connected in parallel. Efficiency is improved in the power amplifier by using a 1:1 turn ratio to increase the coupling coefficient of the transformers. Efficiency is improved in the power amplifier by angling the transformers in a 45 degree angle relative to a centerline, where the outputs of the secondary windings are closest to the centerline to reduce parasitic routing in the power amplifier and, thus, increasing the quality factor of the transformers. The angling of the transformers enables an accessibility to the center taps that is not easily accessible in conventional power amplifiers. Such accessibility enables and/or facilitates harmonically tuning power amplifiers to increase efficiency of the power amplifier. The output power of the power amplifier is increased due to the parallel couplings of the secondary windings of the transformers.

Modifications are possible in the described embodiments, and other embodiments are possible, within the scope of the claims.

What is claimed is:

1. An apparatus comprising:
 a first transformer including:
  a first transformer winding having an output at a first proximal end and a first center tap at a first distal end; and
 a second transformer including:
  a second transformer winding having an output at a second proximal end and a second center tap at a second distal end, the first proximal end having a first distance from the second proximal end and the first distal end having a second distance from the second distal end, the first distance less than the second distance.

2. The apparatus of claim 1, wherein:
 the first transformer winding includes:
  a first output and a second output, wherein the second output is at the first proximal end; and
  a first number of turns; and
 the second transformer winding includes:
  a third output and a fourth output, wherein the fourth output is at the second proximal end, the first output coupled to third output, and the second output coupled to the fourth output; and
  a second number of turns.

3. The apparatus of claim 2, wherein:
 the first transformer includes a third transformer winding having a third number of turns equal to the first number of turns of the first transformer winding; and
 the second transformer includes a fourth transformer winding having a fourth number of turns equal to the second number of turns of the second transformer winding, wherein the first and second transformer windings are secondary windings and the third and fourth transformer windings are primary windings.

4. The apparatus of claim 3, wherein:
 the third transformer winding includes a first input; and
 the fourth transformer winding includes a second input.

5. The apparatus of claim 2, wherein:
 the first transformer winding includes:
  a first vertex located at the first output; and
  a second vertex located at the first center tap, wherein a first centerline is defined by the first vertex and the second vertex; and
 the second transformer winding includes:
  a third vertex located at the second output; and
  a fourth vertex located at the second center tap, wherein a second centerline is defined by the third vertex and the fourth vertex; and a third centerline extending between the first transformer winding and the second transformer winding and bisecting the first output and the second output, the first centerline and the third centerline forming a first acute angle, the second centerline and the third centerline forming a second acute angle.

6. The apparatus of claim 1, wherein:

the first transformer winding includes a first number of turns;

the second transformer winding includes a second number of turns; and the first transformer includes a first primary winding having turns, and the second transformer includes a second primary winding having turns, in which a sum of the turns of the first and second primary windings is a third number of turns, wherein a sum of the first number of turns and the second number of turns is equal to the third number of turns.

7. The apparatus of claim 1, wherein:

the output of the first transformer winding is a first output, and further including a second output;

the output of the second transformer winding is a fourth output, and further comprising a third output, the first output coupled to the third output, and the second output coupled to the fourth output;

the first transformer includes a third transformer winding having a first input at a first end and having a second end; and the second transformer includes a fourth transformer winding having a third end coupled to the second end and a second input at a fourth end.

8. The apparatus of claim 7, further comprising:

a primary center tap coupled to the second and third ends; and a trace coupled to the primary center tap.

9. The apparatus of claim 8, wherein the trace has a width, the width to tune a second harmonic frequency to adjust a signal at one or both of the first and second inputs.

10. A system comprising:

a driver stage configured to output a signal;

a transformer circuit coupled to an output of the driver stage and including:

a first transformer winding having a first proximal end and a first distal end; and a second transformer winding having a second proximal end and a second distal end, the first proximal end having a first distance from the second proximal end and the first distal end having a second distance from the second distal end, the first distance less than the second distance; and an output stage coupled to the first and second transformer windings and configured to increase a power of the signal.

11. The system of claim 10, wherein the system comprises:

a biasing circuit;

wherein the first transformer winding includes a first center tap located at the first distal end and coupled to the biasing circuit; and wherein the second transformer winding includes a second center tap located at the second distal end and coupled to the biasing circuit.

12. The system of claim 11, wherein the biasing circuit is a DC biasing circuit.

13. The system of claim 10, wherein:

the first transformer winding and the second transformer winding are secondary windings, the transformer circuit further including at least one primary winding having a first number of turns, the secondary windings having a combined number of turns equal to the first number of turns.

14. The system of claim 10, wherein:

the first transformer winding includes a first output and a second output, the second output is at the first proximal end; and the second transformer winding includes a third output and a fourth output, the fourth output at the second proximal end, the first output coupled to third output and the second and fourth outputs coupled together.

15. The system of claim 10, wherein:

the first transformer winding includes:

a first output located at the first proximal end;

a first vertex located at the first output;

a first center tap located at the first distal end; and a second vertex located at the first center tap, wherein a first centerline is defined by the first vertex and the second vertex; and the second transformer winding includes:

a second output located at the second proximal end;

a third vertex located at the second output;

a second center tap located at the second distal end; and a fourth vertex located at the second center tap, wherein a second centerline is defined by the third vertex and the fourth vertex; and a third centerline extending between the first transformer winding and the second transformer winding and bisecting the first output and the second output, the first centerline and the third centerline forming a first acute angle, the second centerline and the third centerline forming a second acute angle.

16. The system of claim 15, wherein the first centerline and the second centerline form a right angle.

17. The system of claim 10, wherein the transformer circuit is implemented by complimentary metal-oxide semiconductors (CMOS) compatible stacked-type on-chip transformers.

18. The system of claim 10, wherein the transformer circuit further includes:

a third transformer winding having a first input at a first end and a second end;

a fourth transformer winding having a third end and a second input at a fourth end; and a primary center tap coupled to the second and third ends.

19. The system of claim 18, further including a trace coupled to the primary center tap.

20. The system of claim 19, wherein the trace has a width, the width to tune a second harmonic frequency to adjust a signal at one or both of the first and second inputs.

* * * * *